United States Patent [19]

Gretsch

[11] Patent Number: 4,829,234
[45] Date of Patent: May 9, 1989

[54] METHOD AND APPARATUS FOR MEASURING THE RESISTANCE OF THE WINDING OF A CONVERTER-FED SINGLE- OR THREE PHASE MACHINE DURING OPERATION

[75] Inventor: Ralf Gretsch, Erlangen, Fed. Rep. of Germany

[73] Assignee: Siemens Aktiengesellschaft, Berlin and Munich, Fed. Rep. of Germany

[21] Appl. No.: 218,819

[22] Filed: Jul. 13, 1988

[30] Foreign Application Priority Data

Jul. 31, 1987 [DE] Fed. Rep. of Germany ....... 3725534

[51] Int. Cl.$^4$ ........................................... G01R 27/08
[52] U.S. Cl. ..................... 324/62; 318/490; 324/522; 324/546; 324/158 MG; 340/648; 363/41
[58] Field of Search .................. 324/62, 64, 546, 547, 324/545, 525, 158 MG, 57 R, 522, 524; 340/648; 363/41; 318/490, 509, 510; 322/99

[56] References Cited

U.S. PATENT DOCUMENTS

| | | | |
|---|---|---|---|
| 3,656,136 | 4/1972 | Blair | 318/490 |
| 4,458,196 | 7/1984 | Goyal et al. | 324/57 R |
| 4,498,044 | 2/1985 | Horn | 324/57 R X |
| 4,520,298 | 5/1985 | Abbondanti | 318/490 |
| 4,562,390 | 12/1985 | Tobise | 318/490 |
| 4,651,086 | 3/1987 | Domenichini et al. | 324/62 X |

FOREIGN PATENT DOCUMENTS

0101773  3/1984  European Pat. Off. .
2907595  9/1979  Fed. Rep. of Germany .
3228815 10/1983  Fed. Rep. of Germany .

*Primary Examiner*—Reinhard J. Eisenzopf
*Assistant Examiner*—Robert W. Mueller
*Attorney, Agent, or Firm*—Kenyon & Kenyon

[57] ABSTRACT

A method and apparatus for measuring the resistance of a winding of a converter-fed single- or three-phase machine during operation by means of a d-c measuring current. The firing instant of at least one up-commutating valve of a maching converter is delayed by a predetermined variable setting angle for generating d-c measuring currents in the phase currents, whereby the current conduction time of the up-commutating valve is shortened and the current conduction time of a valve commutating down with the valve which is commutating up with delay, is lengthened. The generated d-c measuring current is filtered out of the measured machine current and the generated interlinked d-c measuring voltage is filtered out of a measured terminal voltage of the single- or three-phase machine, and the winding resistance is determined from the linked d-c measuring voltage and the d-c measuring current by forming a quotient. Thus, it is possible to measure a winding resistance in a converter-fed three-phase machine during operation without using a nonlinear resistance circuit in a connecting lead.

9 Claims, 3 Drawing Sheets

METHOD AND APPARATUS FOR MEASURING THE RESISTANCE OF THE WINDING OF A CONVERTER-FED SINGLE- OR THREE PHASE MACHINE DURING OPERATION

BACKGROUND OF THE INVENTION

The present invention relates to a method for measuring the resistance of a winding of a converter-fed single- or three-phase machine during operation by means of a d-c measuring current present as the d-c component of the phase current, and to a circuit arrangement for carrying out the method.

From German Patent No. 32 28 815, a circuit arrangement with a d-c measuring voltage source for a winding fed with operating currents of network frequency is known. In at least one of the connecting leads between the network and the winding of a single- or three-phase machine, a non-linear resistance circuit operative only during the measuring time is arranged as the d-c measuring voltage source. The resistance value of this nonlinear resistance circuit changes greatly as a function of the polarity of the operating current of network frequency flowing through it. The d-c voltage component generated in this manner is fed as the d-c measuring voltage, in addition to the winding, to a measuring member which picks up only the d-c voltage. A variable low-resistance resistor with a shunt diode and a shorting switch for the parallel arrangement of the resistor and the diode is provided as the nonlinear resistance circuit, for instance. In this circuit arrangement, the nonlinear resistance circuit must be designed for the full operating current. The nonlinear resistance circuit further causes additional losses during the measurement.

SUMMARY OF THE INVENTION

It is an object of the present invention to provide a method and apparatus for measuring the winding resistance of a converter-fed single- or three-phase machine during operation by means of a d-c measuring current, where a nonlinear resistance circuit can be dispensed with.

The above and other objects of the present invention are achieved by a method for measuring the resistance of a winding of a converter-fed single- or three-phase machine during operation by means of a d-c measuring current present as a d-c component of the phase current wherein for generating d-c measuring currents in the phase currents, the firing instant of at least one up commutating valve of the converter is delayed by a predetermined variable setting angle, whereby the current conduction time of this up-commutating valve is shortened and the current conduction time of a valve commutating down with the valve that is commutating up with delay is lengthened; from the measured machine current the generated d-c measuring current and from a measured terminal voltage of the single- or three-phase machine, the generated interlinked d-c measuring voltage is filtered out, where the measured terminal voltage consists of the phase voltages which respectively contain a d-c component due to the valves commutating with delay; and the winding resistance is determined from the interlinked d-c measuring voltage and the measured d-c current by forming a quotient.

With this method, the firing instants of the converter required for feeding the motor are adjusted during operation asymmetrically in a suitable manner so that a d-c component appears in the machine current if the machine winding is symmetrical. This d-c component in the machine current generated as the d-c measuring current can now be evaluated by simple known means. Since it is known from German Patent No. 32 28 815 that only a small relative d-c voltage of about 0.1 to 1% of the nominal voltage of the three-phase machine is required for the measurement, a shift of at least one firing instant by an adjustment angle of 0.2° to 2° el is sufficient, assuming that the full intermediate link voltage is available in the intermediate link of the converter. If the voltage is reduced, for instance, for low speed of the machine, the required adjustment angle is increased accordingly. Thus, the winding resistance value of a winding of a converter-fed single- or three-phase machine can be measured with this method during operation without using a nonlinear resistance circuit. In addition, the losses are reduced considerably during the measurement but above all, the circuit means required for the measurement are reduced substantially.

In one advantageous process step, the variable setting angle is controlled so that an RMS current formed from the measured machine current is associated continuously with the corresponding setting angle, the measuring d-c current remaining constant.

In converter drives, frequent changes of the torque and the speed can be expected. With a setting-angle set as constant, also fluctuations of the generated d-c measuring voltage or the generated d-c measuring current are produced, whereby errors in the determination of the winding resistance result. By the advantageous process step, i.e., by controlling the setting angle in an open loop, these errors can be avoided since, with constant delay, a practically linear relationship between the RMS machine current depending on the load and the d-c measuring current which adjusts itself, exists. The setting angle varies with the parameters of the converter-machine combination and can be calculated accordingly.

In a further advantageous process step, the variable setting angle is controlled so that the RMS current is inversely proportional to the setting angle. Thus, a hyperbolic function is obtained for the setting angle in dependence on the respective RMS machine current since, in the simplest case, the dependence of the setting angles on the parameters of the converter-machine combination, the d-c measuring current is proportional to the RMS current as well as to the setting angle.

In an advantageous circuit arrangement for carrying out of the method, there is provided in a control set at least one shifting arrangement which shifts the firing instant signal of at least one valve of the converter in time; at least one shunt resistor as arranged in a connecting lead between the converter and the single- or three-phase machine so that it can be bridged where its resistor terminals are tied via a first lowpass to a first input of a quotient former; and a second input of the quotient former is connected via a second lowpass to its two terminals of the converter-fed single- or three-phase machine.

In this circuit arrangement, the d-c measuring current required for the resistance measurement of the winding is generated first by shifting in time in the control unit at least one firing instant signal of at least one valve of the converter by means of a shifting arrangement. This delay of at least one firing instant of a valve is not limited to a 120° control of the converter, but can also be performed in a 180° control of the converter. The d-c measuring current generated in this manner and the d-c measuring voltage components of two phase voltages are fed to a processing circuit which therefrom determines the measured winding resistance value. Thus, a circuit arrangement is obtained, with which a winding resistance value of a winding of a single- or three-phase machine can be measured during operation without using a nonlinear resistance in a connecting lead between the network and the winding of the machine. Also the dissipation loss during the measurement is reduced considerably.

In a further advantageous circuit arrangement, the resistor terminals of the shunt resistor are linked to an RMS value converter, the output of which is connected to a characteristic-curve generator, and the output of the characteristic curve generator is linked to the presetting inputs of the first programmable backward counter of the shifting arrangement.

By means of this circuit arrangement, fluctuations of the d-c measuring voltage or the d-c measuring current due to the frequent changes of the torque and the speed of the converter-fed single- or three-phase machine can be leveled off. Since with constant delay time of a valve, a linear relationship exists between the RMS and the machine current depending on the load and the d-c measuring current that adjusts itself, the variable setting angle can be controlled in this simple manner. That is, in the characteristic curve or family of characteristic curves is stored for each RMS value of the machine current, a corresponding setting angle of a valve of the converter, so that the d-c measuring current remains constant. In the simplest case a hyperbolic function is stored as the characteristic curve in the characteristic curve-field generator, i.e., the variable setting angle is inversely proportional to the RMS value of the machine current.

BRIEF DESCRIPTION OF THE DRAWINGS

For explaining the invention further, reference is made to the drawings, in which embodiments according to the invention are illustrated schematically.

DETAILED DESCRIPTION

Figure 1:
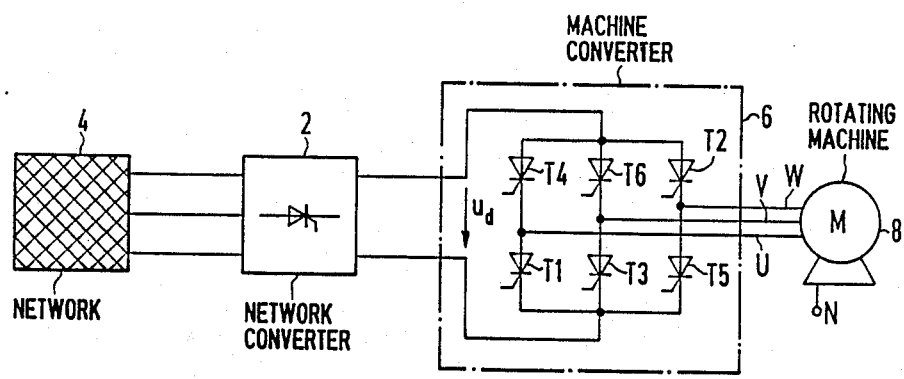
FIG. 1 shows a circuit arrangement of a converter-fed drive.

In FIG. 1, a circuit arrangement of a converter-fed drive is shown. A converter 2 on the network side converts three-phase power exchanged with a network 4 at a network frequency $f_N = 50$ or 60 Hz into a d-c voltage $u_d$ or a d-c current of adjustable magnitude. The converter 6 on the machine side generates therefrom three-phase power which is exchanged with a single- or three-phase machine 8 of variable frequency $f_M = 0$ to $f_{max}$. As the converter 6 on the machine side, a three-phase bridge circuit with the thyristors T1 to T6 is provided.

The three bridge arms are connected to the single- or three-phase machine by means of connecting leads U, V and W, also called phase conductors. For reasons of clarity, the controls of the converter 2 on the network side and the converter 6 on the machine side are not shown.

Figure 2:
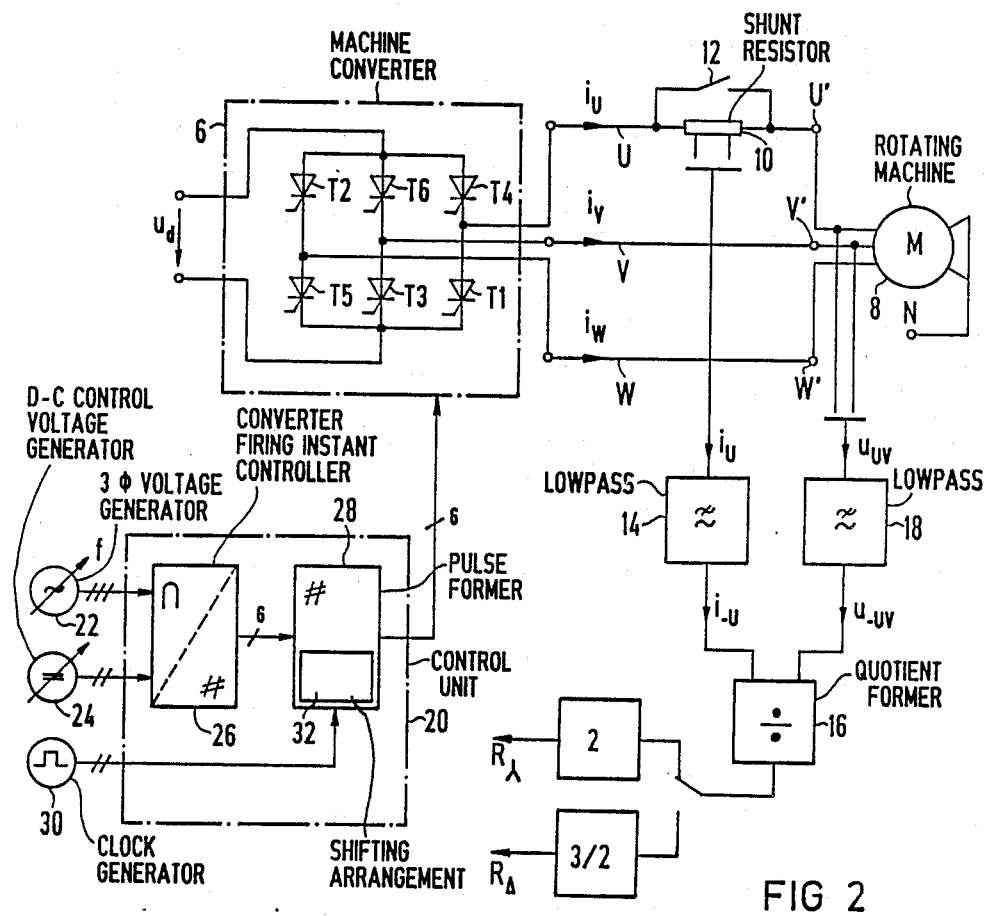
FIG. 2 shows a block diagram of the circuit arrangement for carrying out the method according to the invention.

In FIG. 2, a block diagram of the circuit arrangement for carrying out the method according to the invention is shown. For reasons of clarity, the network 4 and the converter 2 on the network side are not shown. To the converter 6 on the machine side is fed at the input the intermediate-link voltage $u_d$ and on the output side, the converter 6 is linked by means of the connecting leads U, V and W to the input terminals U', V' and W' of the single- or three-phase machine 8. In the connecting lead U, a shunt resistor 10 is arranged which can be bridged by means of a switch 12. The terminals of the shunt resistor 10 are linked to a first lowpass 14, the output of which is connected to a first input of a quotient former 16. The input terminals U' and V' of the single- or three-phase machine 8 are fed to a second lowpass 18. The output of this second lowpass 18 is tied to a second input of the quotient former 16. The converter 6 receives the firing pulses from a control unit 20, each firing pulse consisting of a pulse train. Into this control unit 20 is set the desired frequency of the rotating machine field via a three-phase voltage generator 22, the voltages of which need not necessarily be sinusoidal. In addition, the control unit 20 is linked to a d-c control voltage generator 24, the d-c control voltage of which determines the firing delays relative to the zero crossings of the given three-phase voltage system. In the converter block 26 are fixed from the analog three-phase voltages and the d-c control voltage, the firing instants for the valves T1 to T6 which are present digitally at the output of the converter block 26. These digital firing instants are fed to a pulse former 28 which delivers to the respective valve T1 to T6 of the converter 6 a train of firing pulses, the repetition frequency of which is determined by a clock generator 30. In addition, the pulse former 28 of the control unit 20 contains a shifting arrangement 32 which shifts a firing instant of a valve T1 to T6 of the converter 6 in time. If one wanted to shift all firing instants of the valve T1 to T6 of the converter 6 in time, as many shifting arrangements 32 are required as valves are provided in the converter 6.

The current is measured via the shunt resistor 10 which is required only during the measurement. This measured machine current $i_U$ contains a d-c component $i_{-U}$, which is also called the d-c measuring current $i_{-U}$. By means of the lowpass 14, the d-c measuring current $i_{-U}$ is filtered from the measured machine current $i_U$ and fed to the quotient former 16. The linked voltage $u_{UV}$ on which also a d-c component, namely, a measured d-c voltage $\mu_{-UV}$, is superimposed, can be measured directly at the machine terminals U' and V' and fed to the lowpass 18. This lowpass 18 filters the d-c measuring voltage $u_{-UV}$ from the linked voltage $u_{UV}$ and feeds it to the quotient former 16.

With a symmetrical winding of the single- or three-phase machine 8, the d-c component in the macine current $i_{-W}$ flowing via the terminal W' is 0, if the voltage-time areas of the phase voltages $u_U$ and $u_V$ caused by a valve T6 fired with delay by an adjustment angle are equal with the opposite sign. Thereby is obtained, with the d-c components $i_{-U} = -i_{-V}$, the resistance of a winding in the case of a Y-circuit of the winding of the machine as $R_Y = u_{-UN}/i_{-U}$ or $R_Y = \frac{1}{2} u_{-UV}/i_{-U}$ where the voltage $u_{-UN}$ is the phase voltage and the terminal N is the Y point of the single or three-phase machine 8. If the windings of the single- or three-phase machine 8 are delta-connected, the resistance value of a winding is obtained as $R_\Delta = 3/2\, u_{-UV}/i_{-U}$.

With an asymmetrical delta-connected winding of a three-phase machine 8, a setting angle $\Delta\alpha$ is set at the valve $T_2 T_5$ in such a manner that $u_{-UV} = u_{-UW}$, so that the voltage drop at the resistance $R_{VW}$ becomes $u_{-VW} = 0$. By measurement of the corresponding d-c measurement currents $i_{-V}$ and $i_{-W}$, the current resistances $R_{UV} = U_{-UV}/i_{-V}$ and $R_{UW} = u_{-UW}/i_{-W}$ are obtained. In the case of an asymmetrical Y-connected winding of a three-phase machine 8, it is sufficient to measure the Y voltages $u_{UN}$, $u_{VN}$ and $u_{WN}$ and the phase currents $i_U$, $i_V$ and $i_W$ and to divide the values associated with the same phase conductor by each other. The procedure for determining the resistance $R_{VW}$ is similar.

Figure 3:
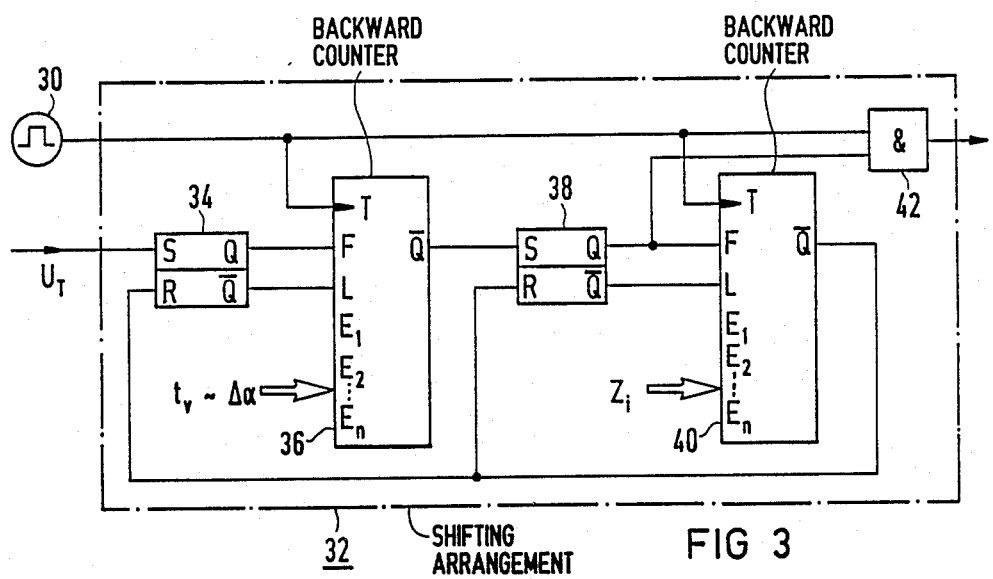
FIG. 3 shows a shifting arrangement of a control unit according to FIG. 2.

FIG. 3 shows an embodiment of the shifting arrangement 32 of the pulse former 28 of the control unit 20. An undelayed firing instant signal $U_T$ of the converter block 26 is fed to a set input S of a first RS flip-flop 34, the noninverting output Q of which is tied to an enable input F of the first backward counter 36. The inverting output $\overline{Q}$ of the RS flip-flop 34 is connected to an input L of the first backward counter 36, whereby the presetting of the first backward counter 36 is accomplished, i.e., the backward counter 36 is set to a preset counter reading. A clock input T of the first backward counter 36 is connected to the clock generator 30. An inverting output $\overline{Q}$ of the first backward counter 36 is connected to a set input S of RS flip-flop 38, the noninverting output Q of which is connected to an enable input F of a second backward counter 40 and on the other hand, to the input of an AND gate 42. The inverting output $\overline{Q}$ of the second RS flip-flop 38 is connected to an input L of the second backward counter 30, whereby a preset counter value is activated. The inverting output $\overline{Q}$ of the second backward counter 40 is linked to respective reset inputs R of the first and second RS flip-flop 34 and 38. The clock generator 30 is likewise connected to the clock input T of the second backward counter 40 and to a second input of the AND gate 42. As backward counters 36 and 40, settable inverse counters are provided, where any desired numbers can be set via setting inputs $E_l$ to $E_n$. At the first backward counter 36 is set at the setting inputs $E_l$ to $E_n$, the setting angle $\Delta\alpha$ or a delay time $t_v$ corresponding to this setting angle $\Delta\alpha$ as a multiple of the clock frequency delivered by the clock generator 30. On the second backward counter 40 the number of pulses of the firing pulse train $Z_i$ is set.

Upon the arrival of an initially undelayed firing instant signal $U_T$ from the converter block 26, the output Q of the first RS flip-flop 34 is set to "high" and the first backward counter 36 is enabled thereby. Thereby, this backward counter 36 counts at the clock frequency of the clock generator 30 from the preset value backwards to the value 0. When the counter reading 0 of the first backward counter 30 is reached, the second RS flip-flop 38 is set which in turn releases the second backward counter 40. From the preset number of desired pulses in the pulse train, the former likewise counts backwards at the clock frequency. At the same time, at the output of the AND gate 42, the pulses of the firing pulse train are made ready, the firing instant of this firing pulse train being shifted by a predetermined setting angle $\Delta\alpha$. When the second backward counter 40 has reached the counter reading 0, this backward counter 40 resets the two RS flip-flops 34 and 38, i.e., the outputs Q of the RS flip-flops 34 and 38 are set to "low" while the outputs $\overline{Q}$ of the RS flip-flop 34 and 38 are set to "high". By these low signals at the output Q of the RS flip-flops 34 and 38, the two backward counters 36 and 40 and the AND gate 42 are blocked. By the high signal at the outputs $\overline{Q}$ of the RS flip-flops 34 and 38, the respective presetting of the two backward counters 36 and 40 is accomplished, whereby the counters 36 and 40 arrive at the respective predetermined counter reading. Thereby, this shifting arrangement 32 is ready for the next cycle.

Figure 4:
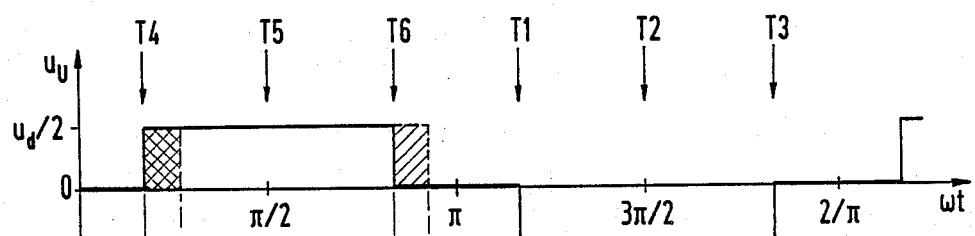
FIGS. 4 to 6 illustrate a mode of operation of a valve fired with delay in a 120° control of the converter of the converter-fed drive.
Figure 5:
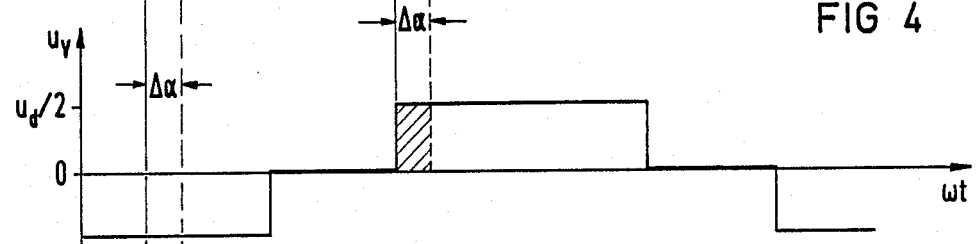
Figure 6:
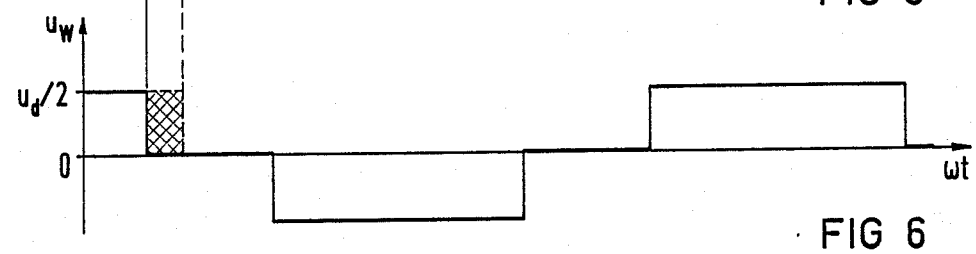

In FIGS. 4 to 6, the operation of a valve T6 of the converter 6, fired with delay, is shown for a 120°-control of the converter 6. In FIG. 4, the phase voltage $u_U$ is plotted in a diagram over the period $2\pi$. This phase voltage $u_U$ can be taken off at the output of the converter 6 at an amplitude $u_d$ of the intermediate-link voltage at the input of the converter 6. In addition, the firing instants of the valves T1 to T6 of the converter 6 are indicated by the arrows T1 to T6. In FIGS. 5 and 6, respectively, the phase voltage $u_V$ and $u_W$ are plotted in a diagram over the period $2\pi$. All three phase voltages $u_U$, $u_V$ and $u_W$ together form a three-phase system. If the firing instant of the valve T6 which is commutating up, is shifted by a setting angle $\Delta\alpha$, the delayed firing of the valve T6 in the bridge arm V has an effect on the phase voltages $u_U$ and $u_V$. Due to the delayed up commutation of the valve T6 in the bridge arm V, the valve T4 in the bridge arm U commutates down with delay. This delay of the commutation between the phases U and V by an angle $\Delta\alpha$ has a positive or negative effect on the phase voltage $u_U$ and $u_V$, respectively. At the machine terminals U' there appears thereby the voltage/time area shown shaded in FIG. 4, whereby the current conduction time is increased and the voltage/time area appears at the same time negative at the machine terminal V', whereby the current conduction time is shortened. The mean relative d-c voltage present at the terminals U'-N is then $u_{-UN}/\hat{u} = \Delta\alpha/2\pi$, where N is the Y-terminal of the three-phase machine 8; the mean relative d-c voltage present at the terminals V'-N is $u_{-UN}/\hat{u} = \Delta\alpha/2\pi$ and the mean relative d-c voltage present at the terminals U'-V', i.e., the relative interlinked d-c voltage present is $u_{-UV} = \Delta\alpha/\pi$. Since only a small relative d-c voltage of about 0.1 to 1% of the nominal voltage of the single- or three-phase machine 8 is required for measuring the resistance of the winding, a shift of the firing instant of an up-commutating valve by small angles $\Delta\alpha = 0.2°$ to 2° el. is sufficient if the full intermediate-linked voltage $u_d$ is available in the intermediate link. If the intermediate-link voltage $u_d$ is reduced, for instance, at low speed of the machine, the required setting angle is increased accordingly.

In addition to the delayed firing of the valve T6 by a setting angle $\Delta\alpha$, another valve of the converter 6 can also be fired with delay. It is shown in FIG. 4 that also the valve T4 is fired with delay. Thereby, the valve T2 in the bridge arm W commutates down with delay. This delay of the commutation between the phases U and W by a setting angle $\Delta\alpha$ has a negative or positive effect on the phase voltage $u_U$ and $u_W$, respectively. Since the setting angle $\Delta\alpha$ of the valve T6 is equal to the setting angle $\Delta\alpha$ of the valve T4, the voltage/time areas of the phase voltages $u_U$ cancel each other, whereby no d-c component $u_{-U}$ is generated. However, due to the delayed firing of the valve T6 and T4, a d-c voltage component $u_{-V}$ and $u_{-W}$ is generated. To obtain the interlinked d-c component $u_{-VW}$, the terminal voltage $u_V, u_W$, of the single- or three-phase machine 8 must be fed to the lowpass 18. In addition, the phase current $i_V$ or $i_W$ must be fed to the lowpass 14; they can be measured by means of a shunt resistor. Thus, several valves T1 to T6 of the converter 6 can be fired simultaneously with delay in order to generate d-c measurement currents $i_{-U}$, $i_{-V}$ and $i_{-W}$.

Instead of the shift in the commutation of the positive current from phase U to phase V as shown in FIGS. 4 to 6, any other positive or negative commutation can, of course, be used for generating the d-c component in voltage and current. The desired effect can, of course, be also achieved by a shift $\Delta\alpha$ in the leading or lagging direction. In Table 1, the effect of a firing instant delay at the valves T1 to T6 on the d-c component in the various legs U, V and W of the machine is shown if 120°-control of the converter is assumed.

TABLE 1

| Firing Delay at Valve | Polarity of d-c Voltage | Effect on Leg |
| --- | --- | --- |
| T1 | pos. | U |
|  | neg. | W |
| T2 | pos. | V |
|  | neg. | W |
| T3 | pos. | V |
|  | neg. | U |
| T4 | pos. | W |
|  | neg. | U |
| T5 | pos. | W |
|  | neg. | V |
| T6 | pos. | U |
|  | neg. | V |

Figure 7:
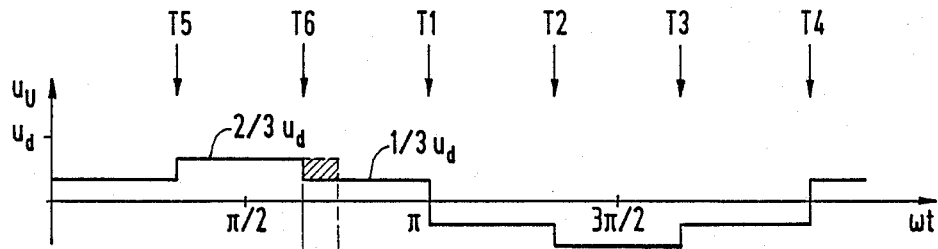
FIGS. 7 to 9 show the mode of operation of a valve fired with delay, of the converter-fed drive.
Figure 8:
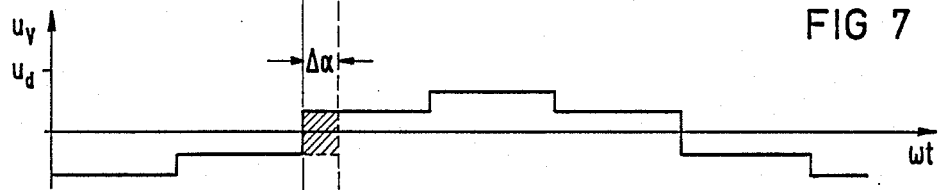
Figure 9:
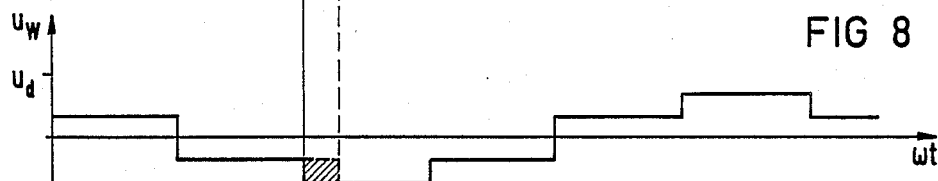

In FIGS. 7 to 9, the operation of a valve T6 of the converter 6, fired with delay, is shown for a 180° control of the converter 6. In FIGS. 7, 8 and 9, respectively, the phase voltage $u_U$, $u_V$ and $u_W$ is plotted in a diagram over the period $2\pi$. Also here, the arrows T1 to T6 indicate the firing instants of the valves T1 to T6 of the converter 6 for $-180°$-control. If, with 180° control, a valve T6 is commutated up delayed by a setting angle $\Delta\alpha$, a positive or negative d-c component is generated in the three legs U, V, W. The d-c components are shown by shaded voltage/time areas, i.e., if the firing instant of the valve T6 is shifted by the setting angle $\Delta\alpha$, the mean relative d-c voltage at the machine terminals U′, V′ and W′, respectively, is positive, negative or positive, respectively. In Table 2, the effect of a firing instant delay at the valves T1 to T6 on the d-c component in the various legs U, V and W of the machine 8 is shown if 180° control of the converter 6 is assumed.

TABLE 2

| Firing Delay at Valve | Polarity of d-c Voltage | Effect on Leg |
| --- | --- | --- |
| T1 | pos. | U |
|  | neg. | V |
|  | neg. | W |
| T2 | pos. | U |
|  | pos. | V |
|  | neg. | W |
| T3 | neg. | U |
|  | pos. | V |
|  | neg. | W |
| T4 | neg. | U |
|  | pos. | V |
|  | pos. | W |
| T5 | neg. | U |
|  | neg. | V |
|  | pos. | W |
| T6 | pos. | U |
|  | neg. | V |
|  | pos. | W |

Figure 10:
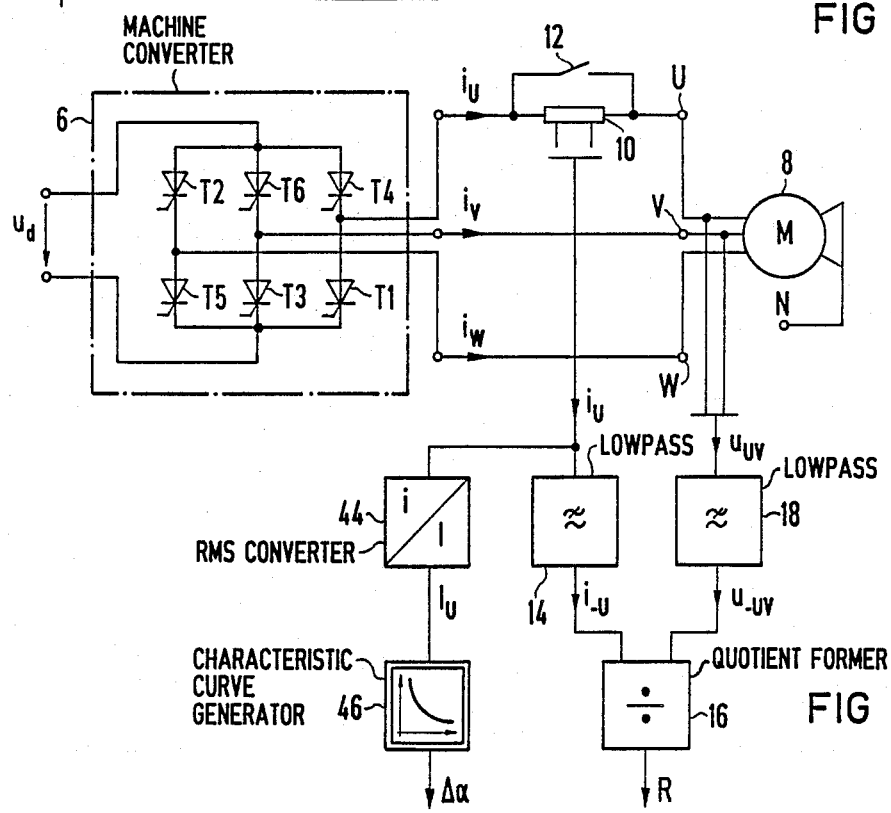
FIG. 10, shows a further embodiment of the block diagram of the circuit arrangement for carrying out the method of FIG. 2 according to the invention.

FIG. 10 shows a further embodiment of the circuit arrangement according to FIG. 2. In converter drives, a frequent change of the torque and the speed is to be expected. With a setting angle $\Delta\alpha$ set constant, also fluctuations of the d-c measuring voltage $u_{-UV}$ or the d-c measuring current $i_{-U}$ are generated. Thereby, also the average or measured winding resistance of a winding of the three-phase machine 8 has an error. For this reason, control of the setting angle $\Delta\alpha$ in an open circuit is provided, since with constant setting angle $\Delta\alpha$ a practically linear relationship exists between the RMS machine current $I_U$ which depends on the load, and the d-c measuring current $i_{-U}$ which adjusts itself. The machine current $i_U$ which is measured by means of the shunt resistor 10 is converted by means of an RMS converter 44 into an RMS machine current $I_U$. This RMS machine current $I_U$ is fed to a characteristic-curve or characteristic-field generator 46. This characteristic-curve generator 46 assigns to each RMS machine current $I_U$ a setting angle $\Delta\alpha$ in such a manner that the d-c measuring current $i_{-U}$ is proportional to the RMS machine current $I_U$ as well as to the setting angle $\Delta\alpha$ so that we have: $\Delta\alpha = \text{constant}/I_{RMS}$, i.e., a hyperbola is obtained as the characteristic-curve. As the characteristic-curve generator 46 can also be provided a programmable memory in which the characteristic is stored. If the RMS machine current $I_U$ is already available as a digital value, a digital RMS machine current value $I_U$ then always corresponds to a memory address, the stored content of which contains a setting angle $\Delta\alpha$. These setting angles $\Delta\alpha$ are fed to the setting inputs $E_I$ to $E_n$ of the first backward counter 36. Thus, the winding resistance of the machine 8 can be measured in a simple manner during operation without error even in the case of frequent changes of torque and speed of the single- or three-phase machine 8.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method for measuring the resistance of a winding of a converter-fed single- or three-phase machine during operation by means of a d-c measuring current present as a d-c component of a phase current, comprising delaying a firing instant of at least one commutating-up valve of a converter coupled to the machine by a predetermined variable setting angle for generating d-c measuring currents in phase currents of the machine, whereby the current conduction time of the commutating-up valve is shortened and the current conduction time of a valve commutating-down with the one commutating-up valve, is lengthened; filtering at least one generated d-c measuring current from a measured phase current and filtering a generated interlinked d-c measuring voltage from a measured terminal voltage of the single- or three-phase machine, where the measured terminal voltage comprises the phase voltages which contain a respective d-c component due to the valves which commutate up with delay; and determining the winding resistance from the interlinked d-c measuring voltage and the d-c measuring current by forming a quotient.

2. The method for measuring the resistance of a winding recited in claim 1, further comprising controlling the variable setting angle so that an RMS current formed from the measured machine current is continuously associated with a corresponding setting angle, the d-c measuring current remaining constant.

3. The method for measuring the resistance of a winding recited in claim 1, further comprising controlling the variable setting angle so that the RMS current is inversely proportioned to the setting angle.

4. The method for measuring the resistance of a winding recited in claim 1, further comprising controlling the variable setting angle in dependence on the amplitude of an intermediate-link voltage fed to the converter coupled to the machine.

5. A circuit arrangement for measuring the resistance of a winding of a converter-fed single- or three-phase machine during operation by means of a d-c measuring current present as a d-c component of a phase current, comprising, means for delaying a firing instant of at least one commutating-up valve of a converter coupled to the machine by a predetermined variable setting angle thereby generating d-c measuring currents in phase currents of the machine, whereby the current conduction time of the commutating-up valve is shortened and the current conduction time of a valve commutating-down with the one commutating-up valve, is lengthened; first means for filtering at least one generated d-c measuring current from a measured phase current and second means for filtering a generated interlinked d-c measuring voltage from a measured terminal voltage of the single- or three-phase machine, where the measured terminal voltage comprises the phase voltages which contain a respective d-c component due to the valves which commutate up with delay; and means for determining the winding resistance from the interlinked d-c measuring voltage and the d-c measuring current by forming a quotient, further comprising a control unit having at least one shifting arrangement which shifts the firing instant of at least one valve of the converter in time; at least one shunt resistor being arranged in a connecting lead between the converter and the single- or three-phase machine so that it can be bridged, the resistor having terminals coupled to said first filtering means comprising a first low pass filter, the first low pass filter being coupled to a first input of said means for forming comprising quotient forming means, the quotient forming means having a second input connected to two terminals of the converter-fed single- or three-phase machine via said second filtering means comprising a second low pass.

6. The circuit arrangement recited in claim 5, wherein the shifting arrangement comprises two RS flip-flops, two backward counters and an AND gate, where the undelayed firing-instant signal is fed to a set input of the first RS flip-flop, of which the noninverting output is tied to an enable input of the first backward counter and an inverting output of the RS flip-flop is connected to an input of the first backward counter, which accomplishes presetting of the first backward counter, a clock input of the first backward counter being connected to a clock generator; an inverting output of the first backward counter being tied to a set input of the second RS flip-flop, the noninverting output of the second RS flip-flop being connected to an enable input of the second backward counter and an inverting output of the second flip-flop being connected to an input of the second backward counter which accomplishes the presetting of the second backward counter, a clock input of the second backward counter being connected to the clock generator; an inverting output of the second backward counter being tied to respective reset inputs of the two RS flip-flops; the clock signals of the clock generator being fed to a first input of the AND gate, a second input of which is tied to the noninverting output of the second RS flip-flop, a delayed pulse train for an up-commutating valve being present at the output of the AND gate.

7. The circuit arrangement recited in claim 6, wherein each of the first and second backward counters comprise a programmable backward counter.

8. The circuit arrangement recited in claim 5, wherein the resistor terminals of the shunt resistor are tied to an RMS value converter having an output connected to a characteristic-curve generator, the characteristic-curve generator being connected to the presetting inputs of the first programmable backward counter.

9. The circuit arrangement recited in claim 8, wherein the characteristic-curve generator comprises a programmable memory.

* * * * *